(12) United States Patent
Arvin et al.

(10) Patent No.: US 8,910,853 B2
(45) Date of Patent: Dec. 16, 2014

(54) ADDITIVES FOR GRAIN FRAGMENTATION IN PB-FREE SN-BASED SOLDER

(71) Applicant: International Business Machines Corporation, Armonk, NY (US)

(72) Inventors: Charles L. Arvin, Poughkeepsie, NY (US); Alexandre Blander, Montreal (CA); Peter J. Brofman, Hopewell Junction, NY (US); Donald W. Henderson, Ithaca, NY (US); Gareth G. Hougham, Ossining, NY (US); Hsichang Liu, Fishkill, NY (US); Eric D. Perfecto, Poughkeepsie, NY (US); Srinivasa S.N. Reddy, Bangalore (IN); Krystyna W. Semkow, Poughquag, NY (US); Kamalesh K. Srivastava, Wappingers Falls, NY (US); Brian R. Sundlof, Verbank, NY (US); Julien Sylvestre, Chambly (CA); Renee L. Weisman, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/932,070

(22) Filed: Jul. 1, 2013

(65) Prior Publication Data

US 2013/0284495 A1 Oct. 31, 2013

Related U.S. Application Data

(62) Division of application No. 12/704,592, filed on Feb. 12, 2010, now Pat. No. 8,493,746.

(51) Int. Cl.
*B23K 31/02* (2006.01)
*H01L 21/44* (2006.01)
(Continued)

(52) U.S. Cl.
CPC ............. *H01B 1/02* (2013.01); *H05K 3/3436* (2013.01); *B23K 35/3602* (2013.01); *C22C 13/00* (2013.01); *H05K 2201/0209* (2013.01); *B23K 35/0244* (2013.01); *B23K 35/262* (2013.01); *H01L 23/49866* (2013.01); *H05K 3/3463* (2013.01); *H05K 2201/0257* (2013.01); *H01B 13/00* (2013.01); *B23K 35/36* (2013.01); *B82Y 30/00* (2013.01)
USPC ....... 228/180.22; 228/246; 438/613; 438/614

(58) Field of Classification Search
None
See application file for complete search history.

(56) References Cited

U.S. PATENT DOCUMENTS 5,170,930 A * 12/1992 Dolbear et al. ............. 228/123.1
5,520,752 A 5/1996 Lucey et al.

(Continued)

FOREIGN PATENT DOCUMENTS

JP 7178587 7/1995
JP 2002-248596 A * 9/2002
WO WO 2005115679 A1 12/2005

*Primary Examiner* — Kiley Stoner
(74) *Attorney, Agent, or Firm* — Scully, Scott, Murphy & Presser, P.C.; Steven J. Meyers

(57) ABSTRACT

In one embodiment of the present invention, inert nano-sized particles having dimensions from 1 nm to 1,000 nm are added into a solder ball. The inert nano-sized particles may comprise metal oxides, metal nitrides, metal carbides, metal borides, etc. The inert nano-sized particles may be a single compound, or may be a metallic material having a coating of a different material. In another embodiment of the present invention, a small quantity of at least one elemental metal that forms stable high melting intermetallic compound with tin is added to a solder ball. The added at least one elemental metal forms precipitates of intermetallic compounds with tin, which are dispersed as fine particles in the solder.

17 Claims, 6 Drawing Sheets

(51) Int. Cl.
*B23K 35/36* (2006.01)
*C22C 13/00* (2006.01)
*B23K 35/02* (2006.01)
*B23K 35/26* (2006.01)
*H01L 23/498* (2006.01)
*H01B 13/00* (2006.01)
*H01B 1/02* (2006.01)
*H05K 3/34* (2006.01)
*B82Y 30/00* (2011.01)

(56) References Cited

U.S. PATENT DOCUMENTS

| | | | | |
|---|---|---|---|---|
| 5,863,493 | A * | 1/1999 | Achari et al. | 420/557 |
| 5,964,963 | A * | 10/1999 | Turchan et al. | 148/22 |
| 5,965,197 | A | 10/1999 | Jin et al. | |
| 5,981,081 | A | 11/1999 | Sue | |
| 6,005,292 | A * | 12/1999 | Roldan et al. | 257/777 |
| 6,127,253 | A * | 10/2000 | Roldan et al. | 438/612 |
| 6,139,979 | A * | 10/2000 | Takaoka et al. | 428/646 |
| 6,274,224 | B1 * | 8/2001 | O'Bryan et al. | 428/209 |
| 6,365,973 | B1 | 4/2002 | Koning | |
| 6,471,115 | B1 | 10/2002 | Ijuin et al. | |
| 6,569,262 | B1 | 5/2003 | Shohji | |
| 6,630,251 | B1 | 10/2003 | Carter et al. | |
| 6,656,422 | B2 | 12/2003 | Masuda | |
| 6,805,974 | B2 | 10/2004 | Choi et al. | |
| 6,811,881 | B1 | 11/2004 | Clough | |
| 6,811,892 | B2 | 11/2004 | Yeh et al. | |
| 6,908,517 | B2 | 6/2005 | Segal et al. | |
| 7,172,643 | B2 | 2/2007 | Shohji | |
| 7,186,392 | B2 | 3/2007 | Gole | |
| 7,224,067 | B2 | 5/2007 | Suh | |
| 7,511,232 | B2 | 3/2009 | Hata et al. | |
| 7,964,961 | B2 * | 6/2011 | Lee et al. | 257/737 |
| 2002/0000651 | A1 * | 1/2002 | Takizawa et al. | 257/697 |
| 2002/0149113 | A1 | 10/2002 | Ray et al. | |
| 2003/0219623 | A1 | 11/2003 | Kao et al. | |
| 2004/0112478 | A1 * | 6/2004 | Bieler et al. | 148/538 |
| 2005/0045855 | A1 | 3/2005 | Tonapi et al. | |
| 2006/0081681 | A1 | 4/2006 | Pipkin | |
| 2006/0154468 | A1 * | 7/2006 | Tanaka et al. | 438/613 |
| 2007/0034305 | A1 * | 2/2007 | Suh | 148/561 |
| 2008/0164488 | A1 | 7/2008 | Ikeda et al. | |
| 2009/0014746 | A1 | 1/2009 | Ramirez et al. | |
| 2009/0301606 | A1 * | 12/2009 | Ueshima | 148/24 |
| 2010/0112353 | A1 * | 5/2010 | Sun et al. | 428/407 |
| 2010/0200988 | A1 | 8/2010 | Farooq | 257/738 |
| 2010/0266870 | A1 * | 10/2010 | Nishimura | 428/646 |
| 2011/0101405 | A1 | 5/2011 | Chang et al. | |
| 2011/0115084 | A1 * | 5/2011 | Ueshima et al. | 257/738 |
| 2011/0133331 | A1 | 6/2011 | Lin et al. | |
| 2011/0244252 | A1 * | 10/2011 | Loh | 428/433 |
| 2012/0202343 | A1 * | 8/2012 | Belanger et al. | 438/614 |
| 2013/0284495 | A1 * | 10/2013 | Arvin et al. | 174/126.1 |

* cited by examiner

ADDITIVES FOR GRAIN FRAGMENTATION IN PB-FREE SN-BASED SOLDER

CROSS REFERENCE TO RELATED APPLICATION

This application is a divisional of U.S. patent application Ser. No. 12/704,592, filed on Feb. 12, 2010, now U.S. Pat. No. 8,493,476, the entire content and disclosure of which is incorporated herein by reference.

FIELD OF THE INVENTION

The present invention relates to metallic alloys, and particularly to lead-free alloys of tin that may be employed in a Controlled Collapse Chip Connection (C4) ball. The present invention also relates to structures employing the same, and methods of forming the same.

BACKGROUND

Use of lead free-alloys for C4 balls is increasing to reduce environmental impacts. Upon solidification, the tin-based (Sn-based) prior art alloy materials tend to form large grains in the lead-free C4 balls. The number of grains in the solidified lead-free C4 balls is correspondingly small, e.g., typically from 1 to 5, and more typically from 1 to 3. Tin has a tetragonal structure and the physical properties, such as deformation under stress and diffusion, depend upon Sn-grain orientation. When a small number of Sn-grains are present in a typical C4 ball, undesirable Sn-grain orientation will result in stress buildup in Si-device and decrease in electromigration reliability.

Thus, formation of a small number of grains in the lead-free C4 ball, e.g., 1 or 2, creates more stress on the semiconductor chip than formation of a large number of grains in the lead-free C4 ball, all other parameters for the C4 balls being equal. Many-grained C4 ball containing, for example, 5 or 10 grains per C4 ball with random orientation, is conducive to stress-mitigation and enhanced electromigration resistance. However, increasing the number of grains in a C4 ball has been very difficult to achieve. For electromigration reliability, decreasing diffusion rates inside the Sn-grains and along grain boundaries is desirable and may be achieved with suitable Sn-alloy compositions.

SUMMARY

The present invention provides an alloy composition for a solder ball that results in formation of small particles or precipitates after solidification, thereby enhancing electromigration reliability, structures for the same, and methods for forming the same.

According to an aspect of the present invention, a solder ball is provided, which includes:

inert nano-sized particles having dimensions from 1 nm to 1,000 nm in all directions and comprising a metal oxide, a metal nitride, a metal oxynitride, a metal carbide, a semiconductor carbide, or a metal boride; and tin (Sn) at an atomic concentration of at least 95%.

According to another aspect of the present invention, another solder ball is provided, which includes:

precipitates of an intermetallic alloy of at least one elemental metal and tin located inside Sn-grains and at grain boundaries between grains, wherein an atomic concentration of the at least one elemental metal is less than 3.0%, wherein the at least one elemental metal forms an intermetallic compound with tin, and wherein the at least one elemental metal is a metal other than Ag and Cu; and Sn at an atomic concentration of at least 95%.

According to yet another aspect of the present invention, a method of forming a semiconductor structure is provided, which includes:

applying a solder ball on a metallic pad, wherein the solder ball comprises tin (Sn) at an atomic concentration of at least 95% and at least one of at least one elemental metal and inert nano-sized particles, wherein the at least one elemental metal forms an intermetallic compound with tin and is a metal other than Ag and Cu, and wherein the inert nano-sized particles have dimensions from 1 nm to 1,000 nm in all directions and comprises a metal oxide, a metal nitride, a metal oxynitride, a metal carbide, a semiconductor carbide, or a metal boride; and reflowing the solder ball at an elevated temperature, wherein the intermetallic compound of the at least one elemental metal or the inert nano-sized particles are distributed as small particles inside grains and across grain boundaries.

DETAILED DESCRIPTION

As stated above, the present invention relates to lead-free alloys of tin that may be employed in a solder ball such as a Controlled Collapse Chip Connection (C4) ball, and structures for employing the same, and methods of forming the same, which are now described in detail with accompanying figures. Typical C4 balls have a diameter from 10 microns to 200 microns, and are employed in semiconductor structures to bond a semiconductor chip to a substrate.

Figure 1:
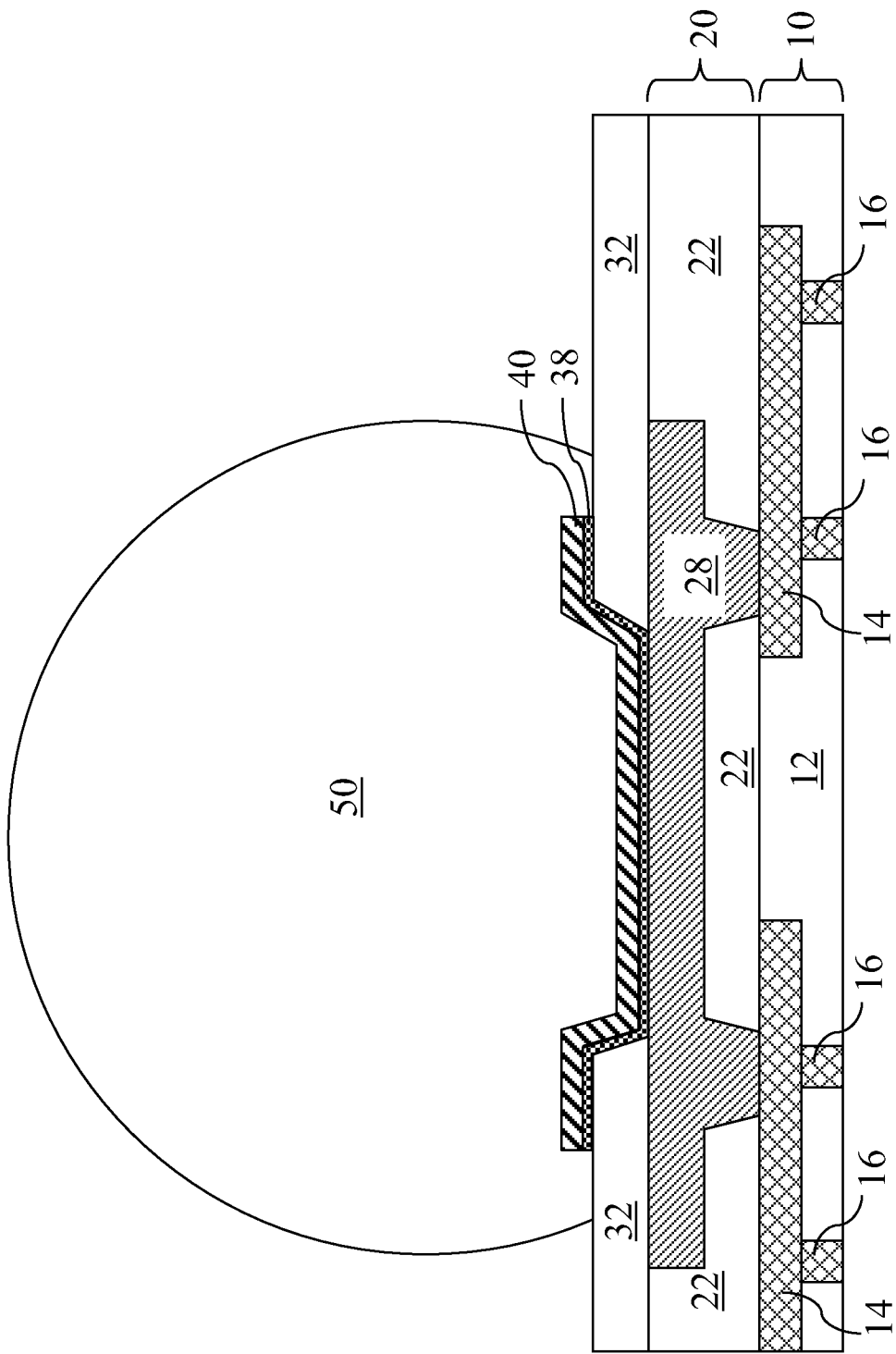
FIG. 1 shows a vertical cross-sectional view of an exemplary semiconductor structure according to the present invention.

Referring to FIG. 1, an exemplary semiconductor structure is shown in which a solder ball of the present invention is employed as a C4 ball. The exemplary semiconductor structure is a non-limiting example of uses of the solder ball of the present invention, which may be employed in any structure requiring solder of one structure to another. While the present invention is described employing the exemplary semiconductor structure, the solder ball of the present invention may be employed in any such structures to reduce electromigration within the solder ball. Such variations are explicitly contemplated herein.

The exemplary semiconductor structure comprises a back-end-of-line (BEOL) interconnect structure 10, a last level interconnect structure 20, and a dielectric passivation layer 32 that are formed on a semiconductor substrate (not shown). Semiconductor devices (not shown) are formed on the semiconductor substrate by employing semiconductor manufacturing processes known in the art. Typically, additional BEOL interconnect structures (not shown) are present between the semiconductor devices and the BEOL interconnect structure 10. The additional BEOL interconnect structures facilitate wiring of the semiconductor devices.

The BEOL interconnect structure 10 includes a back-end-of-line (BEOL) dielectric layer 12, back-end-of-line (BEOL) metal lines 14, and back-end-of-line (BEOL) metal vias 16. The BEOL metal lines 14 and the BEOL metal vias 16 are embedded in the BEOL dielectric layer 12. The BEOL dielectric layer 12 may comprise silicon oxide or a low-k dielectric material known in the art. The BEOL metal lines 14 and the BEOL metal vias 16 comprise a conductive metal such as Cu, and are formed by methods well known in the art.

The last level interconnect structure 20 includes a last level dielectric layer 22 and a last level metal plate 28. The last level dielectric layer 22 comprises a dielectric material such as silicon oxide. The last level metal plate 28 comprises a metal such as aluminum. Typically, the last level metal plate 28 is integrally formed with at least one via that electrically connects the last level metal plate 28 with the BEOL metal lines 14.

The dielectric passivation layer 32 comprises an impervious dielectric material that blocks ingress of moisture and oxygen into the last level interconnect structure 20. Exemplary impervious dielectric materials include silicon nitride. The dielectric passivation layer 32 may be a homogeneous layer comprising the impervious dielectric material, or may be a stack of multiple dielectric material layers including an impervious dielectric material layer. The thickness of the dielectric passivation layer 32 may be from 2.0 μm to 40 μm, and typically from 4.0 μm to 20 μm. Organic materials may be included in the dielectric passivation layer 32.

The dielectric passivation layer 32 has an opening that exposes a top surface of the last level metal plate 28. The dimension of the opening, e.g., a diameter of the opening, may be from 20 μm to 300 μm, and typically from 50 μm to 100 μm. The opening is formed by lithographic patterning of a photosensitive resist that is removed after patterning of the opening, or a photosensitive polyimide which may form a part of the passivation layer 32.

A metallic adhesion layer and/or a diffusion barrier layer is deposited by chemical vapor deposition (CVD) or physical vapor deposition (PVD), i.e., sputtering. The metallic adhesion layer comprises a metallic material that provides good adhesion to underlying structures including the last level metal plate 28 and the dielectric passivation layer 32. Exemplary materials for the metallic adhesion layer comprise Ti, TiN, and TiW. The thickness of the metallic adhesion layer may be from 100 nm to 500 nm, although lesser and greater thicknesses are also explicitly contemplated herein.

A metal pad layer is formed directly on the metallic adhesion layer by sputtering, i.e., physical vapor deposition, by plating, or by a combination thereof. The metal pad layer may comprise Ni, Cu, or an alloy thereof, and has a thickness from 1 μm to 10 μm, and typically from 1.5 μm to 5.0 μm, although lesser and greater thicknesses are contemplated herein also.

The metallic adhesion layer and the metal pad layer are lithographically patterned to form a metallic adhesion portion 38 and a metal pad portion 40. The metallic adhesion portion 38 and the metal pad portion 40 collectively constitute a C4 pad (38, 40).

A C4 ball 50 is applied to each C4 pad within a semiconductor chip. The C4 ball 50 directly contacts a top surface of the C4 pad (38, 40). The C4 ball 50 may directly contact a portion of the passivation layer 32 along the periphery of the C4 pad (38, 40). The diameter of the C4 ball may be from 10 μm to 200 μm, and typically from 50 μm to 100 μm, although lesser and greater diameters are contemplated herein also. The C4 ball 50 may be a perfect sphere, an oblate ellipsoid, a prolate ellipsoid, a scalene ellipsoid, a superellipsoid, or in general any set of convex surfaces constituting a closed three dimensional volume. Further, the shape of the C4 ball 50 may be modified by the structure of the surface abutting the C4 ball 50 such as the shape of the C4 pad (38, 40). In case the C4 ball 50 is not a perfect sphere, the term, "diameter" is used herein to denote the greatest dimension across the C4 ball 50 between two surfaces of the C4 ball 50.

According to a first aspect of the present invention, the C4 ball 50 may comprise inert nano-sized particles and comprising a metal oxide, a metal nitride, a metal oxynitride, a metal carbide, a semiconductor carbide, or a metal boride. The C4 ball 50 is a Sn-based lead-free solder ball. The C4 ball 50 contains Sn at an atomic concentration of at least 95%.

As used herein, the term "inert" denotes a material property of not capable of reacting with tin to form a compound of tin at a temperature lower than reflowing temperature of the tin-based solder, i.e., at a temperature lower than 260° C. Thus, an inert particle does not react with tin when placed in a Sn-containing solder such as the C4 ball 50 and when reflowed at a reflowing temperature of a tin-based solder, i.e., which is lower than 260° C. As used herein, the term "nano-sized" denotes a material property of having dimensions that range from 1 nm to 1,000 nm in all directions. As used herein, the term "particle" denotes a three-dimensional solid having a finite volume and finite dimensions in all directions. Thus, a nano-sized particle is a three-dimensional solid of a finite volume and has a finite dimension from 1 nm to 10,000 nm between one end of the three-dimensional solid to an opposite end of the three-dimensional solid in all directions.

In one case, the C4 ball 50 consists of Sn and the inert nano-sized particles. The quantity of the inert nano-sized particles is less than 5 volume percent. Preferably, the quantity of the inert nano-sized particles is less than 3 volume percent in total concentration.

In another case, the C4 ball 50 comprises Sn and at least one metal. Typical at least one metal that may be added to the composition of the C4 ball 50 of the present invention includes Ag and Cu. In case Ag is added to the C4 ball 50, the atomic concentration of Ag may be from 0.1% to 2.3%, and preferably from 0.5% to 1.1%. In case Cu is added to the C4 ball 50, the atomic concentration of Cu may be from 0.1% to 1.0%, and typically from 0.5% to 0.7%. In case both Ag and Cu are added to the C4 ball 50, the at least one metal includes at least one of Ag at an atomic concentration from 0.1% to 2.3% and Cu at an atomic concentration from 0.1% to 1.0%, and the atomic concentration of the at least one elemental metal at an atomic concentration less than 3.4%. The C4 ball 50 may further comprise another metal at an atomic concentration so long as the atomic concentration of Sn is greater than 95%.

According to a first embodiment of the present invention, the nano-sized particles comprise a metal oxide selected from an alkaline oxide, an alkaline earth oxide, a transition metal oxide, a Lanthanide oxide, an Actinide oxide, $Al_2O_3$, and a compound thereof. The metal oxide for the nano-sized particles does not react with tin to form any chemical compound at any temperature lower than a reflowing temperature of the tin-based solder, i.e., at any temperature lower than 260° C. Non-limiting examples of the metal oxide that may be employed for the nano-sized particles include $Al_2O_3$, $CeO_2$, $HfO_2$, $ZrO_2$, $La_2O_3$, $TiO_2$, $SrTiO_3$, $LaAlO_3$, $Y_2O_3$, etc. The metal oxide for the nano-sized particles may be added to the material of the C4 ball 50 prior to fabrication of the mixed material in the shape of the C4 ball 50.

According to a second embodiment of the present invention, the nano-sized particles comprise a metal nitride. The metal nitride for the nano-sized particles does not react with tin to form any chemical compound at a temperature lower than reflowing temperature of the tin-based solder. Non-limiting examples of the metal nitride that may be employed for the nano-sized particles include TiN, TaN, ZrN, HfN, etc. The metal nitride for the nano-sized particles may be added to the material of the C4 ball 50 prior to fabrication of the mixed material in the shape of the C4 ball 50.

According to a third embodiment of the present invention, the nano-sized particles comprise a metal oxynitride selected from an alkaline oxynitride, an alkaline earth oxynitride, a transition metal oxynitride, a Lanthanide oxynitride, an Actinide oxynitride, and a compound thereof. The metal oxynitride for the nano-sized particles does not react with tin to form any chemical compound at a temperature lower than reflowing temperature of the tin-based solder. Non-limiting examples of the metal oxynitride that may be employed for the nano-sized particles include $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, etc. Each value of x is independently from 0.5 to 3 and each value of y is independently from 0 to 2. The metal oxynitride for the nano-sized particles may be added to the material of the C4 ball 50 prior to fabrication of the mixed material in the shape of the C4 ball 50.

According to a fourth embodiment of the present invention, the nano-sized particles comprise a metal carbide. The metal carbide for the nano-sized particles does not react with tin to form any chemical compound at a temperature lower than reflowing temperature of the tin-based solder. Non-limiting examples of the metal carbide that may be employed for the nano-sized particles include TaC, TiC, WC (tungsten carbide), $W_2C$ (tungsten semicarbide), ZrC, HfC, VC, NbC, $Mo_3C_2$, $Fe_3C$ (cementite), $Fe_2C$, $Cr_3C$, $Cr_3C_2$, $CaC_2$ (calcium carbide), etc. The metal carbide for the nano-sized particles may be added to the material of the C4 ball 50 prior to fabrication of the mixed material in the shape of the C4 ball 50.

According to a fifth embodiment of the present invention, the nano-sized particles comprise a semiconductor carbide selected from silicon carbide (SiC). The semiconductor carbide for the nano-sized particles does not react with tin to form any chemical compound at a temperature lower than reflowing temperature of the tin-based solder. The semiconductor carbide for the nano-sized particles may be added to the material of the C4 ball 50 prior to fabrication of the mixed material in the shape of the C4 ball 50.

According to a sixth embodiment of the present invention, the nano-sized particles comprise a metal boride. The metal boride for the nano-sized particles does not react with tin to form any chemical compound at a temperature lower than reflowing temperature of the tin-based solder. Non-limiting examples of the metal boride that may be employed for the nano-sized particles include $TiB_2$, $LaB_6$, FeB, etc. The metal boride for the nano-sized particles may be added to the material of the C4 ball 50 prior to fabrication of the mixed material in the shape of the C4 ball 50.

According to a seventh embodiment of the present invention, the nano-sized particles comprise coated metallic particles including a core of an elemental metal or an intermetallic alloy and a surface coating comprising a metal oxide, a metal nitride, a metal oxynitride, a metal carbide, a semiconductor carbide, or a metal boride that does not form any chemical compound at a temperature lower than reflowing temperature of the tin-based solder, i.e., at a temperature lower than 260° C. Non-limiting examples of the elemental metal and the intermetallic alloy for the core of the nano-sized particles include Cu and a Sn—Ag alloy. Non-limiting examples of the material for the surface coating include all of the materials for the nano-sized particles in the first through sixth embodiments of the present invention as well as boron nitride (BN) and tungsten (W). Preferred examples for the nano-sized particles include BN coated Cu and a W coated Sn—Ag alloy. The coated metallic particles for the nano-sized particles may be added to the material of the C4 ball 50 prior to fabrication of the mixed material in the shape of the C4 ball 50.

According to an eighth embodiment of the present invention, the nano-sized particles comprise any of all possible combination of materials from at least two embodiments of the first through seventh embodiments.

Once a lead-free solder ball containing dispersed nano-particles is placed on top of a pad to which the lead-free ball is to be joined, the lead-free solder ball is subjected to reflow at the elevated temperature. For example, the C4 ball 50 of the exemplary semiconductor structure in FIG. 1 may be reflowed and soldered to the C4 pad (38, 40). The reflow of the C4 ball 50 is facilitated by subjecting the C4 ball 50 and the C4 pad (38, 40) to an anneal at an elevated temperature from 220° C. to 260° C., and typically from 220° C. to 250° C. Typically, the temperature of the anneal is above the liquidus temperature of the alloy comprising the C4 ball 50.

During the reflow, an upper portion of the metal pad portion 40 reacts with the material of the C4 ball 50 to form a solder. The inert nano-sized particles in the C4 ball 50 is dispersed in the C4 ball 50, and functions as nucleation centers to facilitate formation of a plurality of Sn-containing grains. Since the inert nano-sized particles comprise a different material from the material of the Sn-containing grains, the inert nano-sized particles are not incorporated into the crystalline structure of the Sn-containing grains. Instead, the inert nano-sized particles are distributed as fine particles both inside the Sn-grains and at grain boundaries between the Sn-containing grains.

Figure 2:
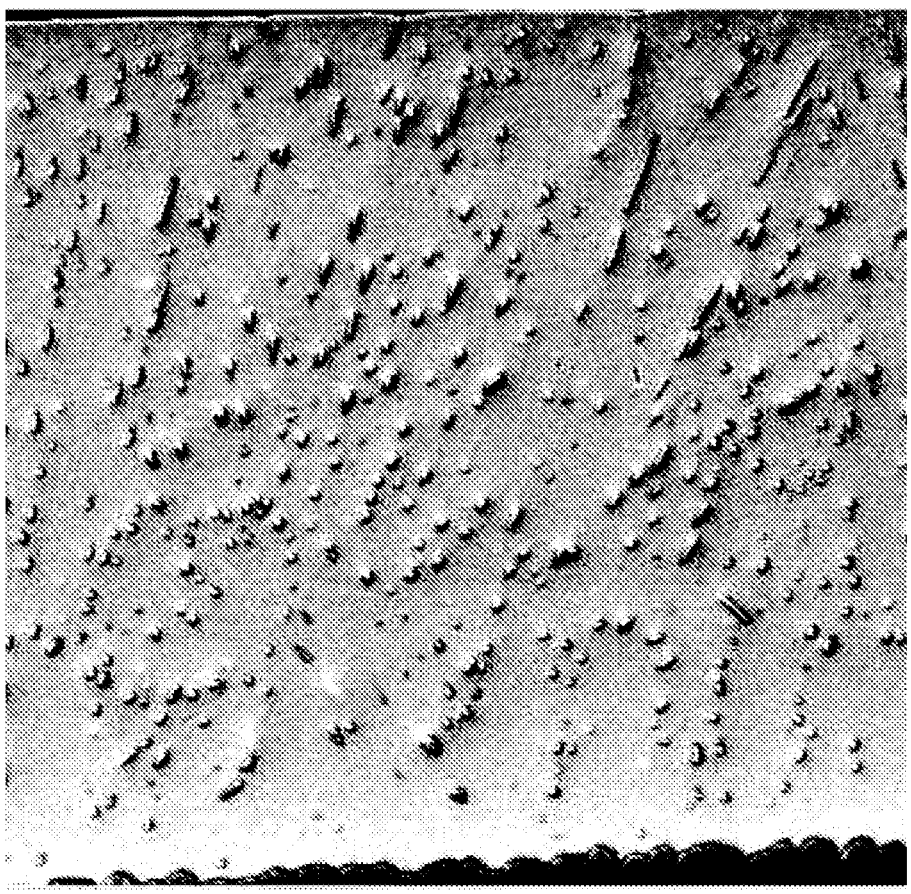
FIG. 2 is a micrograph of a solder ball that contains $Al_2O_3$ nano-sized particles after reflow.

FIG. 2 is a micrograph of a solder ball that contains $Al_2O_3$ nano-sized particles after reflow according to the first embodiment of the present invention. The area of the micrograph is approximately 100 microns×100 microns.

Figure 3:
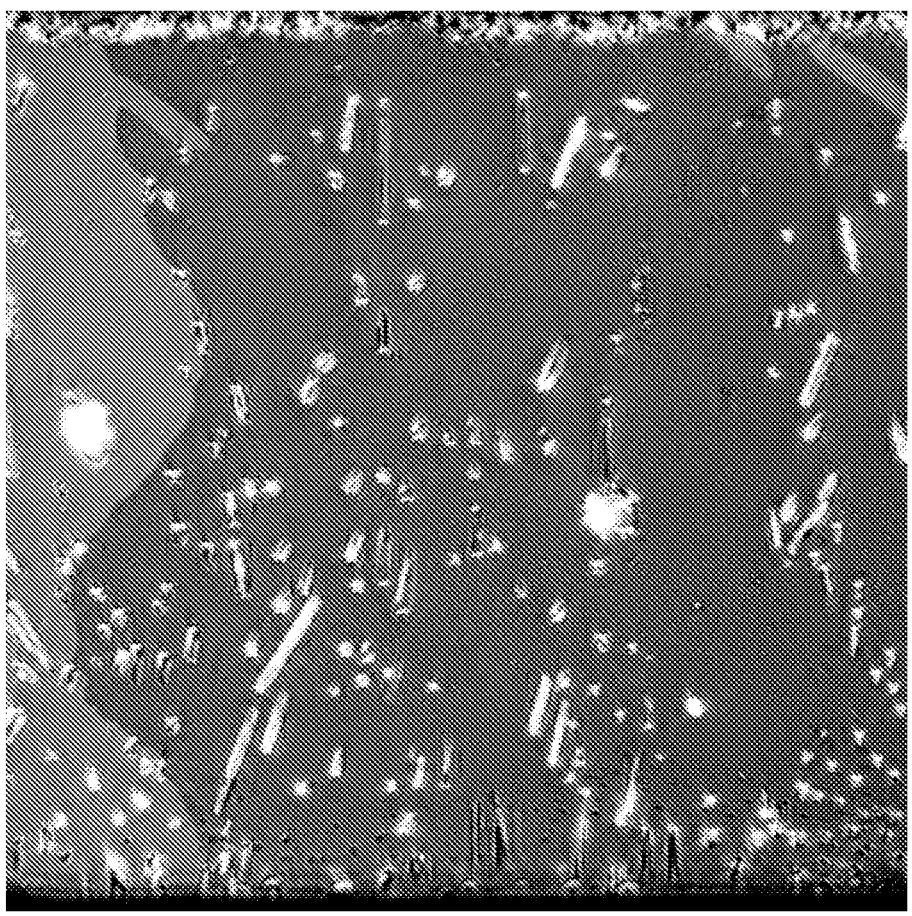
FIG. 3 is a micrograph of a solder ball that contains TiN nano-sized particles after reflow.

FIG. 3 is a micrograph of a solder ball that contains TiN nano-sized particles after reflow according to the second embodiment of the present invention. The area of the micrograph is approximately 100 microns×100 microns.

The C4 ball 50 is subsequently soldered to another conductive structure such as a bonding pad (not shown) of a packaging substrate (not shown) employing methods known in the art. The C4 ball 50 provides a path for conduction of electrical current between a semiconductor chip which includes the C4 pad (38, 40) and the packaging substrate.

The dispersion of nano-particles or intermetallic compounds in C4 solder ball reduces diffusion rates which, in turn, decreases electromigration rates. Such a reduction or elimination of electromigration may be advantageously employed to enhance the reliability of semiconductor structure employing the C4 ball 50 having a composition according to the present invention, or in any structure employing a lead-free Sn-based solder ball that are reflowed and solidified to include nano-sized particles of the intermetallic compounds of the at least one elemental metal with Sn according to the present invention.

According to another aspect of the present invention, the C4 ball 50 may comprise Sn at an atomic concentration greater than 95% and at least one elemental metal other than Ag, Cu, and Sn. The C4 ball 50 is a Sn-based lead-free solder ball. The at least one elemental metal forms stable high melting intermetallic compound with Sn.

In one case, the C4 ball 50 consists of Sn and the at least one elemental metal. The quantity of the at least one elemental metal is less than 5.0% in atomic concentration. Preferably, the quantity of the at least one elemental metal is less than 3.0% in atomic concentration. More preferably, the quantity of the at least one elemental metal is from 0.1% to 1.5% in atomic concentration in the C4 ball 50.

In another case, the C4 ball 50 comprises Sn, the at least one elemental metal, and at least one additional metal. Typical at least one additional metal that may be added to the composition of the C4 ball 50 of the present invention includes Ag and Cu. In case Ag is added to the C4 ball 50, the atomic concentration of Ag may be from 0.1% to 2.3%, and preferably from 0.5% to 1.1%. In case Cu is added to the C4 ball 50, the atomic concentration of Cu may be from 0.1% to 1.0%, and typically from 0.5% to 0.7%. In case both Ag and Cu are added to the C4 ball 50, the at least one metal includes at least one of Ag at an atomic concentration from 0.1% to 2.3% and Cu at an atomic concentration from 0.1% to 1.0%, and the atomic concentration of the at least one at least one elemental metal at an atomic concentration less than 3.4%. The C4 ball 50 may further comprise another metal at an atomic concentration so long as the atomic concentration of Sn is greater than 95%. The total quantity of the at least one elemental metal and the at least one additional metal is less than 5.0% in atomic concentration. Preferably, the quantity of the at least one elemental metal is less than 3.0% in atomic concentration. More preferably, the quantity of the inert nano-sized particles is from 0.1% to 1.5% in atomic concentration.

According to a ninth embodiment of the present invention, the at least one elemental metal in the C4 ball 50 may comprise of metals that form stable intermetallic compounds with Sn. Non-limiting preferred examples of the at least one elemental metal that may be employed for the C4 ball 50 include Ti, Ni, Pt, Mo, Co, Ta, or a combination thereof. Ti, Ni, Pt, Mo, Co, Ta, and combinations thereof provide extremely low solubility in Sn. The at least one elemental metal may be added to the material of the C4 ball 50 prior to fabrication of the mixed material in the shape of the C4 ball 50.

Upon reflowing, the at least one elemental metal is incorporated into the C4 ball 50 and precipitate as intermetallic compounds after solidification. The precipitates contain at least one intermetallic alloy between the at least one elemental metal and Sn. The precipitates are regions of intermetallic compounds located inside grains and at boundary between Sn-containing regions. The dimensions of precipitates are typically less than 10 microns.

The reflow of the C4 ball 50 is facilitated by subjecting the C4 ball 50 and the C4 pad (38, 40) to an anneal at an elevated temperature from 220° C. to 260° C., and typically from 220° C. to 250° C. The same reflow conditions may be employed as described above.

During the reflow, an upper portion of the metal pad portion 40 reacts with the material of the C4 ball 50 to form a solder. Further, the composition of the C4 ball 50, which includes Sn and the at least one elemental metal, and optionally includes Ag, Cu as described above, induces formation of precipitates in the solidifying structure, i.e., in the C4 ball 50, as the temperature is gradually lowered in a latter portion of the anneal. Such precipitates act as nucleation sites which induces formation of multiple grains in the C4 ball 50 as solidified.

Figure 4:
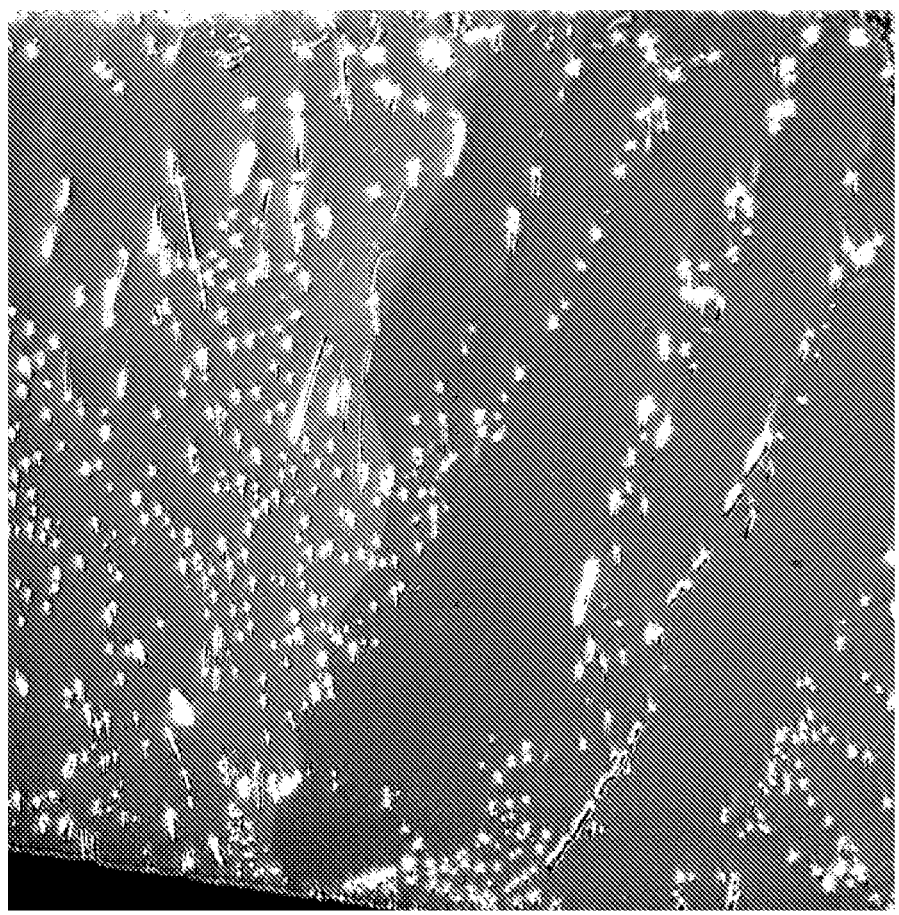
FIG. 4 is a micrograph of a solder ball that contains 0.8% atomic percent of Ti after reflow.

FIG. 4 is a micrograph of a solder ball that contains Ti at atomic concentration of 0.8% after reflow according to the ninth embodiment of the present invention. The area of the micrograph is approximately 100 microns×100 microns. Intermetallic compound between Sn and Ti are distributed as fine particles throughout the solder.

Figure 5:
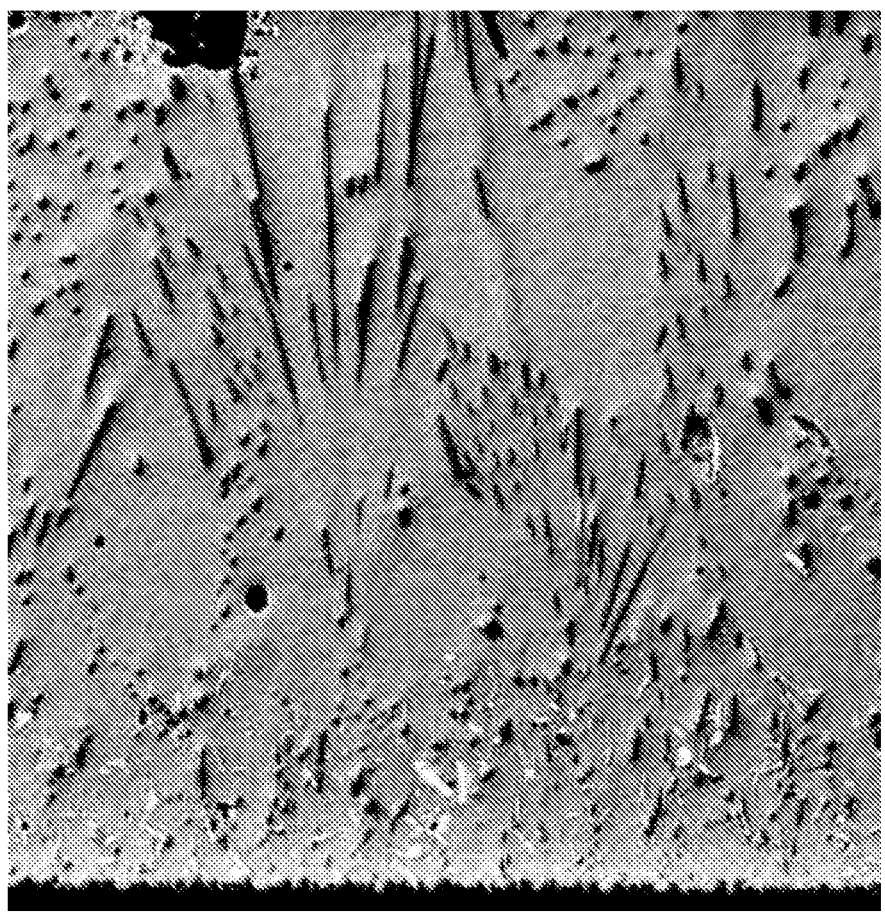
FIG. 5 is a micrograph of a solder ball that contains 0.5% atomic percent of Pt and 0.5% atomic percent of Ti after reflow.
Figure 6:
FIG. 6 is a micrograph of a solder ball that contains 0.15% atomic percent of Ni and 0.35% atomic percent of Ti after reflow.

FIG. 5 is a micrograph of a solder ball that contains Pt at 0.5% in atomic concentration and Ti at 0.5% atomic concentration after reflow according to the ninth embodiment of the present invention. The area of the micrograph is approximately 200 microns×200 microns. The intermetallic compounds are formed between Pt, Sn and Ti, which are distributed as fine particles inside the solder.

FIG. 5 is a micrograph of a solder ball that contains Ni at 0.15% in atomic concentration and Ti at 0.35% atomic concentration after reflow according to the ninth embodiment of the present invention. The area of the micrograph is approximately 100 microns×100 microns. Small particles of intermetallic compound between Sn, Ni and Ti are distributed inside solder.

The C4 ball 50 is subsequently soldered to another conductive structure such as a bonding pad (not shown) of a packaging substrate (not shown) employing methods known in the art. The C4 ball 50 provides a path for conduction of electrical current between a semiconductor chip which includes the C4 pad (38, 40) and the packaging substrate.

Since the precipitates decrease the diffusion rates, a C4 ball 50 having the composition described above, of the present invention, electromigration rates are substantially reduced or eliminated. Such a reduction or elimination of electromigration may be advantageously employed to enhance the reliability of semiconductor structure employing the C4 ball 50 having a composition according to the present invention, or in any structure employing a lead-free Sn-based solder ball that are reflowed and solidified to include precipitates of the intermetallic compounds of the at least one elemental metal with Sn according to the present invention.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A method of forming a semiconductor structure comprising:
   applying a solder ball on a metallic pad, wherein said solder ball comprises Sn at an atomic concentration of at least 95% and at least one of:
      at least one elemental metal that does not form a solid solution with Sn and is selected from Ti, Mo, Co, Ta, and a combination thereof, and
      inert nano-sized particles having dimensions from 1 nm to 1,000 nm in all directions and comprising a metal oxynitride, a metal carbide, or a metal boride; and
   reflowing said solder ball at an elevated temperature, wherein said at least one elemental metal or said inert nano-sized particles induce formation of Sn-containing grains as nucleation centers within said solder ball.

2. The method of claim 1, wherein said solder ball comprises said inert nano-sized particles and said inert nano-sized particles are dispersed in said solder ball, and located inside Sn-grains and at grain boundaries between Sn-containing grains.

3. The method of claim 1, wherein said solder ball comprises said inert nano-sized particles and said inert nano-sized particles comprise a metal oxynitride selected from an alkaline oxynitride, an alkaline earth oxynitride, a transition metal oxynitride, a Lanthanide oxynitride, an Actinide oxynitride, and a compound thereof.

4. The method of claim 1, wherein said solder ball comprises said inert nano-sized particles and said inert nano-sized particles comprise a metal carbide selected from an alkaline earth carbide, a transition metal carbide, a Lanthanide carbide, an Actinide carbide, and a compound thereof.

5. The method of claim 1, wherein said solder ball comprises said inert nano-sized particles and said inert nano-sized particles comprise a metal boride selected from an alkaline earth boride, a transition metal boride, a Lanthanide boride, an Actinide boride, and a compound thereof.

6. The method of claim 1, wherein said solder ball comprises said at least one elemental metal and precipitates of an intermetallic alloy of said at least one elemental metal and tin are formed inside Sn-grains and at grain boundaries during said reflowing.

7. The method of claim 1, wherein said solder ball further comprises at least one of Cu and Ag at an atomic concentration less than 3.4%.

8. A method of forming a semiconductor structure comprising:
   applying a solder ball on a metallic pad, wherein said solder ball comprises Sn at an atomic concentration of at least 95% and inert nano-sized particles having dimensions from 1 nm to 1,000 nm in all directions and containing a metal oxide selected from a Lanthanide oxide, an Actinide oxide, and a compound thereof; and
   reflowing said solder ball at an elevated temperature, wherein said at least one elemental metal or said inert nano-sized particles induce formation of Sn-containing grains as nucleation centers within said solder ball.

9. The method of claim 8, wherein said inert nano-sized particles are dispersed in said solder ball, and located inside Sn-grains and at grain boundaries between Sn-containing grains.

10. The method of claim 8, wherein said solder ball further comprises at least one of Cu and Ag at an atomic concentration less than 3.4%.

11. A method of forming a semiconductor structure comprising:
   applying a solder ball on a metallic pad, wherein said solder ball comprises Sn at an atomic concentration of at least 95% and inert nano-sized particles having dimensions from 1 nm to 1,000 nm in all directions, wherein said inert nano-sized particles comprise coated metallic particles including a core of an elemental metal or an intermetallic alloy and a surface coating comprising a metal oxynitride, a metal nitride, a metal carbide, a semiconductor carbide, or a metal boride that does not form a chemical compound at a temperature lower than 260° C.; and
   reflowing said solder ball at an elevated temperature, wherein said at least one elemental metal or said inert nano-sized particles induce formation of Sn-containing grains as nucleation centers within said solder ball.

12. The method of claim 11, wherein said solder ball comprises said inert nano-sized particles and said inert nano-sized particles are dispersed in said solder ball, and located inside Sn-grains and at grain boundaries between Sn-containing grains.

13. The method of claim 11, wherein said solder ball further comprises at least one of Cu and Ag at an atomic concentration less than 3.4%.

14. The method of claim 1, wherein said at least one elemental metal is Ti or a combination of Ti and a metallic element other than Ti.

15. The method of claim 1, wherein said at least one elemental metal is Mo or a combination of Ti and a metallic element other than Mo.

16. The method of claim 1, wherein said at least one elemental metal is Co or a combination of Ti and a metallic element other than Co.

17. The method of claim 1, wherein said at least one elemental metal is Ta or a combination of Ti and a metallic element other than Ta.

* * * * *